(12) United States Patent
Chalasani et al.

(10) Patent No.: US 6,316,913 B1
(45) Date of Patent: Nov. 13, 2001

(54) LOW DISSIPATION SYSTEM AND METHOD FOR DETERMINING BATTERY CAPACITY AND BATTERY PLANT INCORPORATING THE SAME

(76) Inventors: Subhas C. Chalasani, 4417 Brigade Ct., Plano, TX (US) 75024; Vijayan J. Thottuvelil, 3328 Russell Cir., Plano, TX (US) 75023

( * ) Notice: Subject to any disclaimer, the term of this patent is extended or adjusted under 35 U.S.C. 154(b) by 0 days.

(21) Appl. No.: 09/558,889

(22) Filed: Apr. 26, 2000

(51) Int. Cl.⁷ .......................... H01M 10/44; H01M 10/46
(52) U.S. Cl. ............................................. 320/132
(58) Field of Search .................... 320/116, 117, 320/132; 340/636; 324/426, 427, 433

(56) References Cited

U.S. PATENT DOCUMENTS

| | | | |
|---|---|---|---|
| 4,151,454 | * | 4/1979 | Iida . |
| 5,250,904 | * | 10/1993 | Salander et al. . |
| 5,576,610 | * | 11/1996 | Patino et al. . |
| 5,608,324 | * | 3/1997 | Yoshida . |
| 5,625,237 | * | 4/1997 | Saeki et al. . |
| 5,650,712 | * | 7/1997 | Kawai et al. . |
| 5,656,916 | * | 8/1997 | Hotta . |
| 5,703,486 | * | 12/1997 | Arai et al. . |
| 5,798,646 | * | 8/1998 | Arai . |

* cited by examiner

*Primary Examiner*—Edward H. Tso

(57) ABSTRACT

A system and method for determining a capacity of a battery in a battery string that provides power to a load. In one embodiment, the system includes: (1) a power converter, having an input couplable across the battery and an output couplable across the battery string, that is adapted to transfer power from the battery to the load over a period of time and (2) a voltage sensor, associated with the power converter, that measures voltages of the battery during the period of time, wherein the voltages indicate the capacity of the battery.

21 Claims, 2 Drawing Sheets

LOW DISSIPATION SYSTEM AND METHOD FOR DETERMINING BATTERY CAPACITY AND BATTERY PLANT INCORPORATING THE SAME

TECHNICAL FIELD OF THE INVENTION

The present invention is directed, in general, to battery backup and management systems and, more specifically, to a low dissipation system and method for determining battery capacity and battery plant incorporating the same.

BACKGROUND OF THE INVENTION

The traditional reliability of telecommunication systems that users have come to expect and rely upon is based, in part, on the reliance on redundant equipment and power supplies. Telecommunication switching systems, for example, route tens of thousands of calls per second. The failure of such systems, due to either equipment breakdown or loss of power, is unacceptable, since such failure may result in the discontinuation of millions of telephone calls and a corresponding loss of revenue.

Power plants, such as battery plants, address the power loss problem by providing the system with an energy reserve (e.g., a battery) in the event of the loss of primary power to the system. A battery plant generally operates as follows. The battery plant includes a number of batteries, rectifiers and other power distribution equipment. The primary power is produced by the rectifiers, which convert an AC main voltage into a DC voltage to power the load equipment and to charge the batteries. The primary power may, however, become unavailable due to an AC power outage or the failure of one or more of the rectifiers. In either case, the batteries then provide power to the load. Redundant rectifiers and batteries may be added to the battery plant as needed to increase the availability of the battery plant.

A battery plant that powers telecommunications systems, such as transmission and switching systems in wireless base stations, commonly employs valve-regulated lead-acid (VRLA) batteries as the energy reserve. The batteries are typically coupled directly to the output of the rectifiers and may instantly provide power to the load in the event an AC power outage occurs. During normal operation, the batteries are usually maintained in a fully charged state to maximize a duration for which the batteries can provide energy to the load equipment.

As a battery ages, however, its capacity or energy-storage capability decreases thereby reducing a duration for which the battery can provide energy, even when fully charged. In many telecommunications applications, the battery is considered to have failed when its actual capacity has fallen below a threshold, such as 80% of its rated capacity. A failed battery should be replaced in an orderly fashion to maintain the availability of the battery plant. It is crucial, therefore, to be able to assess whether the capacity of a particular battery has fallen below it's threshold.

The capacity of a battery may be assessed with the battery on-line or off-line. One straightforward approach is to take the battery off-line and couple it to a dissipative-resistive load. The load can then discharge the battery completely or partially at a constant current, thus providing an indication of the battery's capacity. The off-line method, however, requires that the battery be temporarily removed from the battery plant, decreasing the availability thereof. Therefore, to maintain the battery plant at the desired availability level, the capacity of the battery should be assessed on-line.

Completely discharging the battery to assess the capacity also presents major disadvantages. If an AC power outage occurs during or after the discharge test, but before the battery has been fully recharged, the full energy reserve provided by the battery will not be available. This obviously jeopardizes the availability of the battery plant and the reliability of the telecommunications system powered therefrom. Further, since a battery may only be charged and discharged a finite number of times, each cycle of complete discharge and charge necessarily reduces the overall life span of the battery. Additionally, power is typically wasted and unwanted heat is usually generated through the use of conventional battery capacity testing.

Accordingly, what is needed in the art is a system and method for assessing the capacity of a battery that provides an accurate measurement of the battery's capacity while avoiding additional power loss and heat generation.

SUMMARY OF THE INVENTION

To address the above-discussed deficiencies of the prior art, the present invention provides a system and method for determining a capacity of a battery in a battery string that provides power to a load. In one embodiment, the system includes: (1) a power converter, having an input couplable across the battery and an output couplable across the battery string, that is adapted to transfer power from the battery to the load over a period of time and (2) a voltage sensor, associated with the power converter, that measures voltages of the battery during the period of time. The voltages are indicative of the capacity of the battery.

The present invention therefore introduces the broad concept of determining the capacity of a battery by discharging the battery in a low to non-dissipative manner by directing the discharge power to the load. The invention thereby avoids the requirement for additional resistive loads, which are typically physically large, to conduct a battery discharge test. Additionally, removal of the converted heat generated by the dissipated energy is also avoided. Removal of the converted heat is often problematic, especially in outdoor equipment cabinet environments where the batteries are kept in closed compartments.

In one embodiment of the present invention, the power converter transfers the power to the load at a constant current. Testing a battery under a constant current condition allows the battery voltage to be the only test variable, thereby yielding an accurate battery discharge characteristic related to battery capacity.

In one embodiment of the present invention, the power converter is a flyback converter. The flyback converter generally affords a low component count. Additionally, the flyback converter provides isolation between the primary and secondary sides through the use of a transformer. Of course, other power converter topologies may be used as an application may dictate.

In one embodiment of the present invention, the battery remains coupled to another battery in the battery string. Under this test situation, a single battery in a battery string may be tested for short periods of time without disconnecting the battery from the string. The voltage of the battery under test diminishes during the test thereby stressing the other batteries in the string as charging currents through the batteries tend to rise to maintain a constant string voltage.

In one embodiment of the present invention, the battery is decoupled from another battery in the battery string. Under this test situation, the battery may be tested for extended periods of time, since disconnecting the battery effectively removes its battery string from contributing power to the load.

In one embodiment of the present invention, the power converter employs an error amplifier. The error amplifier is used to sense one or more critical currents associated with the battery test, develop an error signal based on a reference current therefrom and provide direction to the power converter for maintaining a constant battery current throughout the duration of the test.

In one embodiment of the present invention, the system further includes a switching arrangement that selectively couples the battery to the power converter. The switching arrangement may thus allow the system to selectively test each battery in the battery string.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
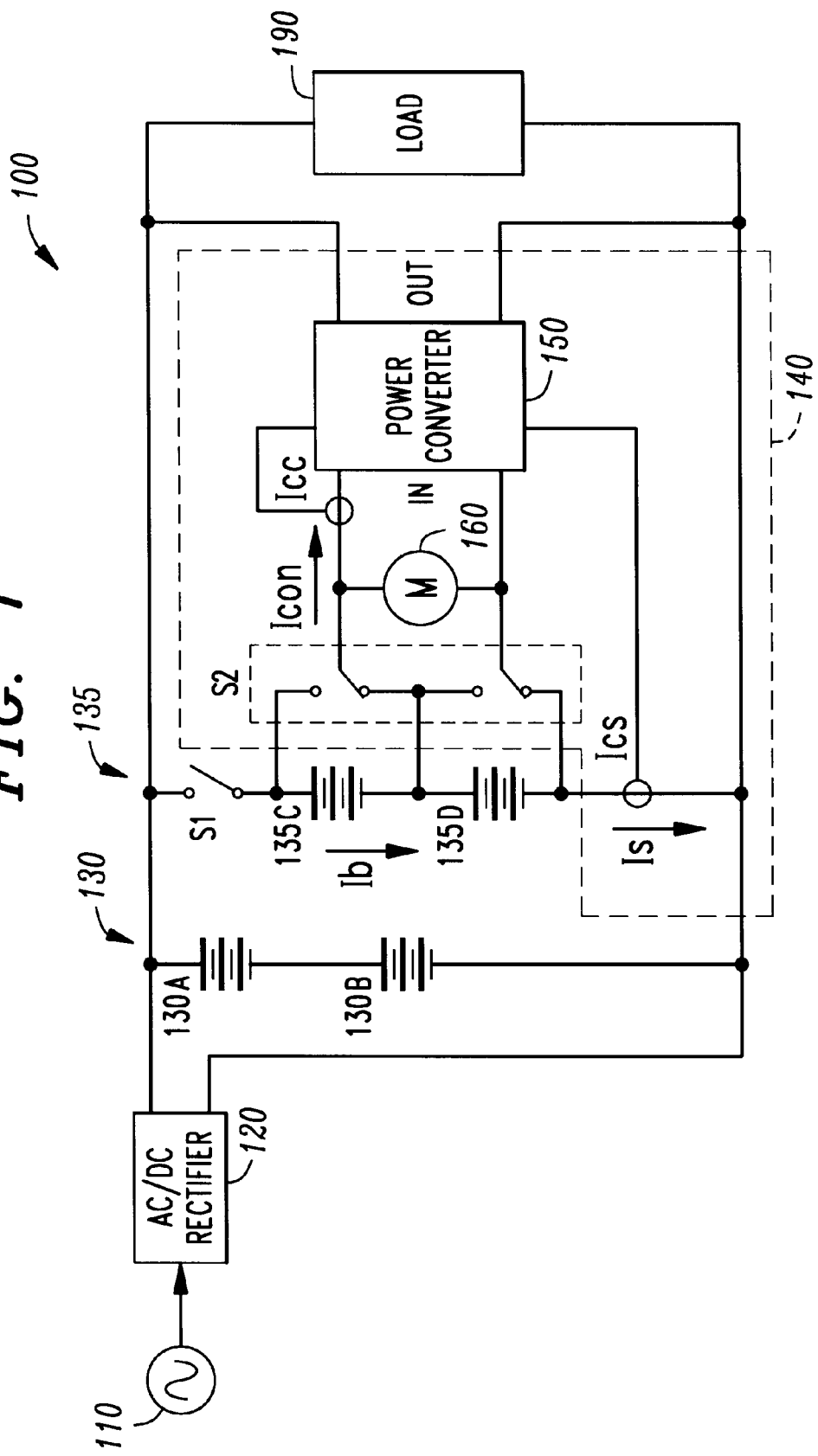
FIG. 1 illustrates a simplified schematic diagram of an embodiment of a power plant constructed in accordance with the principles of the present invention.

Referring initially to FIG. 1, illustrated is a simplified schematic diagram of an embodiment of a power plant (battery plant) 100 constructed in accordance with the principles of the present invention. The power plant 100 is coupled to a source of AC power 110 and provides DC power to a load 190. The power plant 100 is employable to power variable loads (i.e., loads having variable current draw) such as a wireless base station. The current draw of the load 190 may vary, for example, as a function of an amount of voice traffic carried by the wireless base station.

The power plant 100 includes an AC/DC rectifier 120 coupled to the source of AC power 110. Those skilled in the pertinent art will realize, of course, that the power plant 100 may include a number of parallel-coupled AC/DC rectifiers 120, depending on the power requirements of the load 190. The power plant 100 further includes first and second battery strings 130, 135 coupled to an output of the AC/DC rectifier 120. The first and second battery strings 130, 135 are used as a source of backup power in the event the source of AC power 110 is interrupted. Of course, additional battery strings may be added as necessary to increase the overall capacity of the power plant 100. Those skilled in the pertinent art will realize, however, that the power plant 100 may employ only one battery string and be well within the broad scope of the present invention.

In the illustrated embodiment, the first battery string 130 includes first and second batteries 130A, 130B, and the second battery string 135 includes third and fourth batteries 135C, 135D. The first, second, third or fourth battery 130A, 130B, 135C, 135D may be a VRLA battery or any other type of battery, whether conventional or later-developed, that can suffer a decrease in capacity over its lifetime. The second battery string 135 further includes a switch S1 that closes to couple the second battery string 135 to the AC/DC rectifiers 120 and the load 190.

The power plant 100 still further includes a system 140 for determining a capacity of a battery in a battery string (such as the third or fourth battery 135C, 135D of the second battery string 135) that provides power to the load 190. In the illustrated embodiment, the system 140 includes a power converter 150 having an input coupled across the fourth battery 135D via a switching arrangement S2. Of course, the switching arrangement S2 may alternatively couple the input of the power converter 140 across the third battery 135C to allow the system 140 to determine the capacity of the third battery 135C. The switching arrangement S2 allows the system 140 to selectively test a particular battery in the battery string (e.g., the second battery string 135). Those skilled in the pertinent art will realize that the third and fourth batteries 135C, 135D are exemplary of any battery or string of batteries that may be employed in the power plant 100 according to the principles of the present invention.

An output of the power converter 150 is coupled across the load 190, which is coupled across the first and second battery strings 130, 135 and the output of the AC/DC rectifier 120. With the switching arrangement S2 set as shown, the power converter 150 is adapted to transfer power from the fourth battery 135D to the load 190 over a period of time during which the capacity of the fourth battery 135D is being determined.

The system 140 further includes a voltage sensor 160, associated with the power converter 150 and coupled to the fourth battery 135D. The voltage sensor 160 measures voltages of the fourth battery 135D during the period of time, the voltages indicating the capacity of the fourth battery 135D. The system 140 further includes a first current sensor Ics, which senses a string current Is of the second battery string 135. The system 140 still further includes a second current sensor Icc, which senses a converter current Icon into the power converter 150. The string current Is substantially equals the sum of the converter current Icon and a battery current Ib, which is the current through the fourth battery 135D that is under test. Therefore, Is=Icon+Ib or Ib=Is−Icon. By thus measuring the string current Is and regulating the converter current Icon based on the string current Is, the system 140 may maintain the battery current Ib at a substantially constant level during the battery test. The voltage sensor 160 may determine a voltage response over time of the battery, which thus enables the capacity of the battery to be determined more accurately.

Generally, many methods have been proposed for on-line assessment of the capacity of a battery. Some of these methods involve impedance or conductance measurements that may be subject to a number of accuracy and repeatability problems. A more accurate method for assessing the capacity of the battery is to discharge the battery. In the illustrated embodiment, the power converter 150 transfers the power from the fourth battery 135D to the load 190 at a constant current. A complete or partial discharge at a constant current may provide a relatively accurate measurement of the battery's capacity. Testing a battery under a constant current condition allows the battery voltage to be the only test variable thereby yielding an accurate battery discharge characteristic related to battery capacity. By monitoring both the amount of current supplied and the time required to discharge the battery, the total energy delivered by the battery, measured in ampere-hours, may be determined.

Of course, testing the fourth battery 135D on-line indicates that the switch S1 is closed. The fourth battery 135D is thus connected to the third battery 135C. Recall that the fourth battery current, Ib, is given by the equation Ib=Is−Icon, as stated earlier. For the fourth battery current Ib to remain constant, the difference between the second battery string current Is and the converter current Icon should remain substantially constant. The voltage of the third battery 135C may tend to rise to maintain string voltage, due to the voltage level of the first battery string 130. Also, since the voltage of the fourth battery 135D under test may diminish and place the third battery 135C under stress, the fourth battery 135D may need to be tested for shorter periods of time to avoid stressing the third battery 135C.

Alternatively, the fourth battery 135D may be tested off line. With the switch S1 open, the entire second battery string 135 is decoupled from the load 190. The fourth battery current Ib is therefore substantially equivalent to the converter current Icon. Under this test situation, the converter current Icon should be regulated to be constant for the fourth battery current Ib to be substantially constant. Since opening the switch S1 effectively removes the second battery string 135 from contributing power to the load 190 during the battery test, the fourth battery 135D may be tested for extended periods of time to avoid stressing the third battery 135C.

The system 140 may thus determine the capacity of the fourth battery 135D by discharging it in a low to non-dissipating manner and by employing the power converter 150 to direct the discharge power to the load 190. The present invention thereby avoids the requirement for additional resistive loads, which are typically physically large, to conduct a battery discharge test. Additionally, removal of the converted heat generated by the dissipated energy is also avoided. Removal of the converted heat is often problematic, especially in outdoor equipment cabinet environments where the batteries may be kept in closed compartments. While the illustrated embodiment is adapted to test the fourth battery 135D, the ability to choose and isolate an individual battery or battery string for test purposes is well within the broad scope of the present invention.

Figure 2:
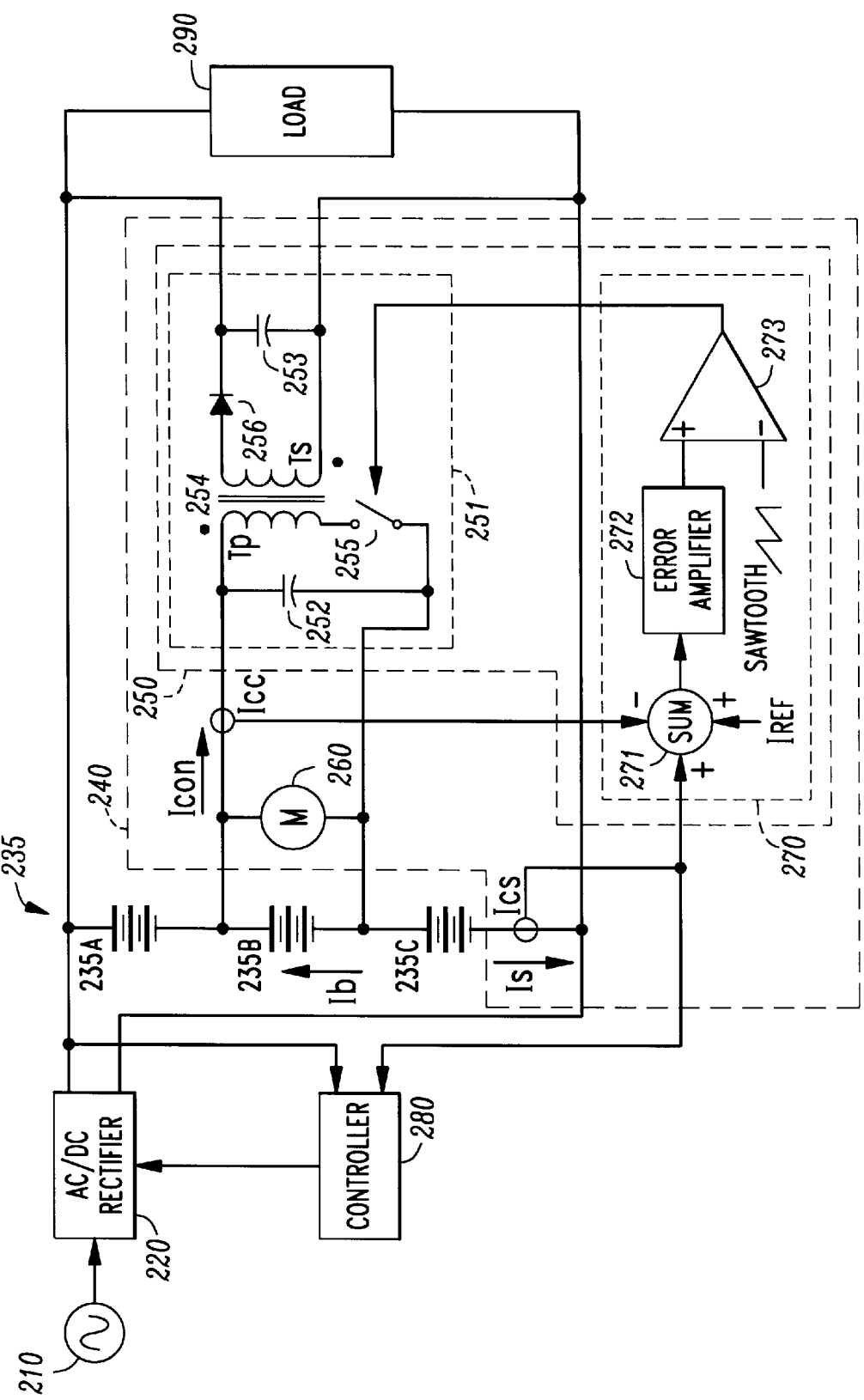
FIG. 2 illustrates a more detailed schematic diagram of an embodiment of a power plant constructed in accordance with the principles of the present invention.

Turning now to FIG. 2, illustrated is a schematic diagram of an embodiment of a power plant 200 constructed in accordance with the principles of the present invention. The power plant 200 may be a battery plant employable to power telecommunications equipment. Of course, other types of power plants are well within the broad scope of the present invention.

The power plant 200 is coupled to a source of AC power 210 and provides DC power to a load 290. The power plant 200 includes an AC/DC rectifier 220 coupled to the source of AC power 210. Of course, the power plant 200 may include a number of parallel-coupled AC/DC rectifiers 220, as required by the load 290. The power plant 200 further includes a battery string 235, having first, second and third batteries 235A, 235B, 235C, coupled to an output of the AC/DC rectifier 220. The battery string 235 is employable as a source of backup power in the event AC power is not available. Of course, additional battery strings may be added as necessary to increase the availability or the capacity of the power plant 200.

The power plant 200 further includes a system 240 for determining a capacity of a battery (e.g., the second battery 235B) in the battery string 235. In the illustrated embodiment, the system 240 includes a power converter 250. The power converter 250 includes a power train 251 configured as a flyback converter having an input capacitor 252, a power switch 255 coupled to a primary winding Tp of a transformer 254, a rectifier diode 256 coupled to a secondary winding Ts of the transformer 254, and an output capacitor 253. The power converter 250 further includes a control unit 270 having a current summing junction 271, an error amplifier 272 and a comparison amplifier 273. The flyback converter configuration affords a low component count and provides isolation between the primary and secondary sides through the use of the transformer 254. Of course, other power converter topologies may be employed and are well within the broad scope of the present invention.

The system 240 further includes a voltage sensor 260 coupled across the battery under test (the second battery 235B). The system 240 further includes a battery string current sensor Ics that senses a battery string current Is and develops a signal indicative of the battery string current Is. The system 240 further includes a power converter current sensor Icc that senses a power converter input current Icon.

The system 240 still further includes a controller 280 that receives the signal indicative of the battery string current Is and accordingly adjusts a voltage of the AC/DC rectifier 220 during the battery test. The battery string current Is may thus be maintained at a predetermined level (e.g., slightly positive) to enhance an accuracy of the battery test.

The control unit 270 operates the switch 255 of the power train 251 to maintain the battery current Ib at a substantially constant level throughout the duration of the battery test. In the illustrated embodiment, the current summing junction 271 receives a reference signal Iref that represents a desired battery current Ib to be maintained during the battery test. The summing junction 271 receives the power converter input current Icon, the battery string current Is and the reference signal Iref and drives the error amplifier 272 accordingly to set the test value of the battery current Ib. The error amplifier 272 and the comparison amplifier 273 cooperate to drive the switch 255 to maintain the converter current Icon such that the battery current Ib may remain substantially constant throughout the duration of the battery test. The battery test is usually performed over a set period of time, during which the voltage of the battery (measured by the voltage sensor 260) may be compared to previously measured data of similar batteries at various stages of ageing (having various capacities). The capacity of the battery under test may thus be determined.

By employing the power converter 250 to transfer power from the second battery 235B to the load 290 during the battery test, the system 240 may thus determine the capacity of the fourth battery 135D in a low to non-dissipating manner. While the illustrated embodiment shows the system 240 coupled to the second battery 235B, those skilled in the art will realize that the system 240 is couplable to any battery within the power plant 200 and may thus determine whether a particular battery has failed.

For a better understanding of power electronics, including a variety of power topologies, see *Power Electronics: Converters, Applications and Design*, by N. Mohan, T. M. Undeland and W. P. Robbins, John Wiley & Sons Publishing Company (1989), which is incorporated herein by reference in its entirety.

Although the present invention has been described in detail, those skilled in the art should understand that they can make various changes, substitutions and alterations herein without departing from the spirit and scope of the invention in its broadest form.

What is claimed is:

1. A system for determining a capacity of a battery in a battery string that provides power to a load, comprising:
   a power converter, having an input couplable across said battery and an output couplable across said string, adapted to transfer power from said battery to said load over a period of time; and
   a voltage sensor, associated with said power converter, that measures voltages of said battery during said period of time, said voltages indicating said capacity of said battery.

2. The system as recited in claim 1 wherein said power converter transfers said power at a constant current.

3. The system as recited in claim 1 wherein said power converter is a flyback converter.

4. The system as recited in claim 1 wherein said battery remains coupled to another battery in said battery string.

5. The system as recited in claim 1 wherein said battery is decoupled from another battery in said battery string.

6. The system as recited in claim 1 further comprising:
   a current sensor that develops a signal indicative of a battery string current of said battery string; and
   a controller that receives said signal and adjusts a voltage of a rectifier associated with said system to maintain said battery string current at a predetermined level.

7. The system as recited in claim 1 further comprising a switching arrangement that selectively couples said battery to said power converter.

8. A method for determining a capacity of a battery in a battery string that provides power to a load, comprising:
   transferring power from said battery to said load over a period of time with a power converter; and
   measuring voltages of said battery during said period of time, said voltages indicating said capacity of said battery.

9. The method as recited in claim 8 wherein said transferring comprises transferring power at a constant current.

10. The method as recited in claim 8 wherein said transferring is performed by a flyback converter.

11. The method as recited in claim 8 wherein said battery remains coupled to another battery in said battery string.

12. The method as recited in claim 8 wherein said battery is decoupled from another battery in said battery string.

13. The method as recited in claim 8 further comprising:
   developing a signal indicative of a battery string current of said battery string; and
   adjusting a voltage of a rectifier associated with said battery string based on said signal to maintain said battery string current at a predetermined level.

14. The method as recited in claim 8 further comprising selectively coupling said battery to said power converter.

15. A battery plant, comprising:
   a battery string that provides power to a load;
   a power converter, having an input couplable across a battery in said string and an output couplable across said string, adapted to transfer power from said battery to said load over a period of time; and
   a voltage sensor, associated with said power converter, that measures voltages of said battery during said period of time, said voltages indicating a capacity of said battery.

16. The battery plant as recited in claim 15 wherein said power converter transfers said power at a constant current.

17. The battery plant as recited in claim 15 wherein said power converter is a flyback converter.

18. The battery plant as recited in claim 15 wherein said battery remains coupled to another battery in said battery string.

19. The battery plant as recited in claim 15 wherein said battery is decoupled from another battery in said battery string.

20. The battery plant as recited in claim 15 further comprising:
   a rectifier, coupled to said battery string, that provides power to said load and to charge said battery string;
   a current sensor that develops a signal indicative of a battery string current of said battery string; and
   a controller that receives said signal and adjusts a voltage of said rectifier to maintain said battery string current at a predetermined level.

21. The battery plant as recited in claim 15 further comprising switching arrangement that selectively couples said battery to said power converter.

* * * * *